United States Patent
Teshigahara et al.

(10) Patent No.: US 11,785,857 B2
(45) Date of Patent: Oct. 10, 2023

(54) PIEZOELECTRIC FILM, METHOD OF MANUFACTURING SAME, PIEZOELECTRIC FILM LAMINATED BODY, AND METHOD OF MANUFACTURING SAME

(71) Applicant: DENSO CORPORATION, Kariya (JP)

(72) Inventors: Akihiko Teshigahara, Kariya (JP); Kazuhiko Kano, Kariya (JP); Kenichi Sakai, Kariya (JP)

(73) Assignee: DENSO CORPORATION, Kariya (JP)

( * ) Notice: Subject to any disclaimer, the term of this patent is extended or adjusted under 35 U.S.C. 154(b) by 596 days.

(21) Appl. No.: 16/937,966

(22) Filed: Jul. 24, 2020

(65) Prior Publication Data

US 2020/0357976 A1    Nov. 12, 2020

Related U.S. Application Data

(63) Continuation of application No. PCT/JP2019/003790, filed on Feb. 4, 2019.

(30) Foreign Application Priority Data

Feb. 21, 2018   (JP) .................................. 2018-028711

(51) Int. Cl.
  *H10N 30/853*   (2023.01)
  *H10N 30/072*   (2023.01)

(52) U.S. Cl.
  CPC ......... *H10N 30/853* (2023.02); *H10N 30/072* (2023.02)

(58) Field of Classification Search
  CPC ............................. H10N 30/853; H10N 30/072
  See application file for complete search history.

(56) References Cited

U.S. PATENT DOCUMENTS

| 2008/0296529 A1 | 12/2008 | Akiyama et al. |
| 2009/0206702 A1 | 8/2009 | Kawakubo et al. |

(Continued)

FOREIGN PATENT DOCUMENTS

| DE | 102015107569 A9 * | 4/2016 | ........... C23C 14/022 |
| JP | 2010114423 A * | 5/2010 | ........... C30B 23/025 |

(Continued)

OTHER PUBLICATIONS

Shannon R. D.: Revised Effective Ionic Radii and Systematic Studies of Interatomic Distances in Halides and Chalcogenides. In: Acta Crystallographica Section A, vol. 32, 1976, No. 5, S. 751-767.—ISSN 0567-7394.

(Continued)

*Primary Examiner* — J. San Martin
(74) *Attorney, Agent, or Firm* — POSZ LAW GROUP, PLC

(57) ABSTRACT

Provided is a piezoelectric film including an AlN crystal, and a first element and a second element doped to the AlN crystal. The first element is an element having an ionic radius larger than an ionic radius of Al. The second element is an element having an ionic radius smaller than the ionic radius of Al. Also provided are piezoelectric film laminated body including an underlayer and a piezoelectric film including ScAlN, and a method of manufacturing the same. The underlayer has a crystal lattice having six-fold symmetry or three-fold symmetry. Also provided are a piezoelectric film including ScAlN having a laminated structure of a hexagonal crystal and a cubic crystal, and a method of manufacturing the same. The cubic crystal is doped with an element other than trivalent element.

9 Claims, 7 Drawing Sheets

(56) References Cited

U.S. PATENT DOCUMENTS

| | | |
|---|---|---|
| 2013/0241673 A1 | 9/2013 | Yokoyama et al. |
| 2016/0064645 A1 | 3/2016 | Teshigahara et al. |
| 2017/0179923 A1 | 6/2017 | Shin et al. |
| 2017/0294894 A1 | 10/2017 | Aida et al. |
| 2018/0041189 A1 | 2/2018 | Lee et al. |
| 2018/0188214 A1 | 7/2018 | Oono et al. |
| 2023/0059734 A1* | 2/2023 | Tonegawa ............ H10N 30/877 |
| 2023/0085754 A1* | 3/2023 | Ino ........................ H01L 29/516 |
| | | 257/295 |

FOREIGN PATENT DOCUMENTS

| | | | |
|---|---|---|---|
| JP | 2011-103323 A | 5/2011 | |
| WO | 2017149675 A1 | 9/2017 | |
| WO | WO-2018008651 A1 * | 1/2018 | ............ C23C 14/06 |
| WO | WO-2023022768 A2 * | 2/2023 | |

OTHER PUBLICATIONS

Saha, Bivas [etal.]: Understanding the Rocksalt-to-Wurtzite phase transformation through microstructural analysis of (Al,Sc)N epitaxial thin films. Applied Physics Letters, 2016, 109. Jg., Nr. 17, S. 172102.

* cited by examiner

PIEZOELECTRIC FILM, METHOD OF MANUFACTURING SAME, PIEZOELECTRIC FILM LAMINATED BODY, AND METHOD OF MANUFACTURING SAME

CROSS REFERENCE TO RELATED APPLICATIONS

The present application is a continuation application of International Patent Application No. PCT/JP2019/003790 filed on Feb. 4, 2019 which designated the U.S. and claims the benefit of priority from Japanese Patent Application No. 2018-028711 filed on Feb. 21, 2018. The entire disclosures of all of the above applications are incorporated herein by reference.

TECHNICAL FIELD

The present disclosure relates to a piezoelectric film, a method of manufacturing the same, a piezoelectric film laminated body, and a method of manufacturing the same.

BACKGROUND

A device using piezoelectric phenomena has been used in a wide range of fields.

SUMMARY

An aspect of the present disclosure is a piezoelectric film including an AlN crystal, and a first element and a second element doped to the AlN crystal. The first element is an element having an ionic radius larger than an ionic radius of Al. The second element is an element having an ionic radius smaller than the ionic radius of Al. Other aspects of the present disclosure are piezoelectric film laminated body including an underlayer and a piezoelectric film including ScAlN, and a method of manufacturing the same. The underlayer has a crystal lattice having six-fold symmetry or three-fold symmetry. Other aspects of the present disclosure are a piezoelectric film including ScAlN having a laminated structure of a hexagonal crystal and a cubic crystal, and a method of manufacturing the same. The cubic crystal is doped with an element other than trivalent element.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
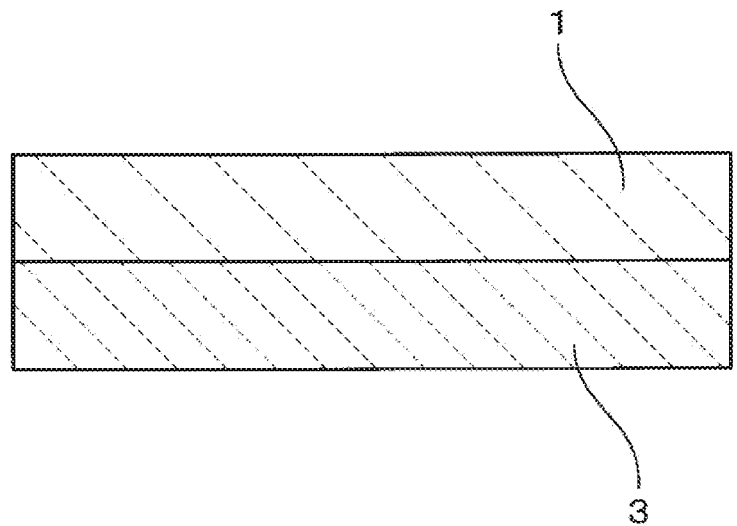
FIG. 1 is a cross sectional schematic view of a piezoelectric film formed on a substrate in a first embodiment.

Usage of a device using piezoelectric phenomena has been expanding particularly in portable equipment such as a portable telephone and a portable information terminal for which reduction of size and power saving are strongly required. For such a device, a piezoelectric film exhibiting piezoelectic performances is used. Specifically, the device is expected to be applied to a surface acoustic wave (i.e., SAW) element or a micro electro mechanical element (i.e., MEMS).

From the viewpoint of exhibition of a high piezoelectric constant, in recent years, a piezoelectric film including aluminum nitride doped with a rare earth element such as scandium has received attention.

In an aluminum nitride film doped with scandium, the piezoelectric performances tend to increase with an increase in doped amount of scandium. However, when the doped amount of scandium is increased too much, the piezoelectric performances sharply decreases.

This is considered due to the following: when the doped amount of scandium is increased to more than a prescribed value, a large compressive stress is caused in a direction orthogonal to a thickness direction in the aluminum nitride film. Then, conceivably, a cubic crystal is generated by a compressive stress in the aluminum nitride film, and an increase in amount of the cubic aluminum nitride results in reduction of piezoelectric performances. An aluminum nitride having high piezoelectric characteristics is of a hexagonal crystal wurtzite structure type.

According to a first aspect of the present disclosure, a piezoelectric film includes: an AlN crystal; a first element doped to the AlN crystal and having an ionic radius in tetracoordination larger than an ionic radius of Al in tetracoordination; and a second element doped to the AlN crystal and having an ionic radius in tetracoordination smaller than the ionic radius of Al in tetracoordination. In the piezoelectric film, a ratio of the number of atoms of the first element to 100 at % of a total amount of the number of atoms of the first element and the number of atoms of Al exceeds 43 at %.

According to a second aspect of the present disclosure, a piezoelectric film laminated body includes an underlayer, and a piezoelectric film including ScAlN and formed on a surface of the underlayer. The underlayer has a six-fold symmetric crystal lattice when a crystal structure of the underlayer is observed from a direction in parallel with a c-axis of a crystal of the ScAlN, and includes an underlayer material having an a-axis length in the six-fold symmetric crystal lattice longer than an a-axis length of the ScAlN.

According to a third aspect of the present disclosure, a piezoelectric film laminated body includes an underlayer, and a piezoelectric film including ScAlN and formed on a surface of the underlayer. The underlayer has a three-fold symmetric crystal lattice when a crystal structure of the underlayer is observed from a direction in parallel with a c-axis of a crystal of the ScAlN, and includes an underlayer material having a nearest neighbor interatomic distance in a lattice plane in parallel with the surface of the underlayer longer than an a-axis length of the ScAlN.

According to a fourth aspect of the present disclosure, in a method of manufacturing a piezoelectric film laminated body having an underlayer, and a piezoelectric film including ScAlN and formed on a surface of the underlayer, the method includes: preparing the underlayer including an underlayer material having a six-fold symmetric crystal lattice when a crystal structure of the underlayer is observed from a thickness direction of the underlayer, and having an a-axis length in the six-fold symmetric crystal lattice longer than an a-axis length of the ScAlN; and epitaxially growing the piezoelectric film including the ScAlN on the underlayer.

According to a fifth aspect of the present disclosure, in a method of manufacturing a piezoelectric film laminated body having an underlayer, and a piezoelectric film including ScAlN and formed on a surface of the underlayer, the method includes: preparing the underlayer including an underlayer material having a three-fold symmetric crystal lattice when a crystal structure of the underlayer is observed from a thickness direction of the underlayer, and having a nearest neighbor interatomic distance in a lattice plane in parallel with the surface of the underlayer longer than an a-axis length of the ScAlN; and epitaxially growing the piezoelectric film including the ScAlN on the underlayer.

According to a sixth aspect of the present disclosure, a piezoelectric film includes ScAlN having a laminated crystal structure of hexagonal crystal and cubic crystal. The ScAlN of cubic crystal is doped with a conductivity imparting element including an element other than a trivalent element.

According to a seventh aspect of the present disclosure, in a method of manufacturing a piezoelectric film by depositing the piezoelectric film including ScAlN on a substrate, the method includes: a deposition initial process of epitaxially growing the piezoelectric film while doping a conductivity imparting element including an element other than a trivalent element at an initial stage of deposition of the piezoelectric film; and a deposition latter process of growing the piezoelectric film substantially without doping the conductivity imparting element after the deposition initial process.

The piezoelectric film of the first aspect, the piezoelectric film laminated bodies of the second and third aspects, and the piezoelectric film of the sixth aspect are excellent in piezoelectric performances such as the piezoelectric constant $d_{33}$. Therefore, the piezoelectric films and the piezoelectric film laminated bodies can contribute to the reduction of size and the power saving of piezoelectric devices.

Each method of manufacturing the piezoelectric film laminated body of the fourth and fifth aspects has an underlayer preparing process and a depositing process. In the underlayer preparing process, the underlayer is prepared. In the fourth aspect, the underlayer has the six-fold symmetric crystal lattice when the crystal structure is observed from the thickness direction, and the a-axis length is longer than the a-axis length of ScAlN. In the fifth aspect, the underlayer has the three-fold symmetric crystal lattice when the crystal structure is observed from the thickness direction, and the nearest neighbor interatomic distance in the lattice plane in parallel with the surface of the underlayer is longer than the a-axis length of ScAlN. Then, in each depositing process in the fourth and fifth aspects, the piezoelectric film is epitaxially grown on the underlayer having such a structure.

In the depositing process, not only a normal compressive stress caused during growth of ScAlN, but also a tensile stress opposite in direction to the compressive stress are caused. This is because the piezoelectric film grows in lattice match with the crystal lattice of the underlayer. In other words, epitaxial growth is caused in lattice match with the underlayer having a longer a-axis length than the a-axis length of ScAlN, and the above-described interatomic distance, thereby causing a tensile stress in the a-axis direction of ScAlN (i.e., the direction orthogonal to the thickness direction of the piezoelectric film).

Therefore, in the depositing process, the compressive stress and the tensile stress having vectors opposite in direction to each other weaken each other. As a result, ScAlN of a hexagonal crystal wurtzite structure becomes more likely to be generated. This results in an increase in content ratio of ScAlN of hexagonal crystal in the piezoelectric film, which can provide a piezoelectric laminated body excellent in piezoelectric performances.

The method of manufacturing the piezoelectric film of the seventh aspect has the deposition initial process and the deposition latter process. In the deposition initial process, at the early stage of deposition of the piezoelectric film, while doping a conductivity imparting element including an element other than trivalent element, the piezoelectric film is epitaxially grown. At the initial stage of growth of the piezoelectric film, cubic ScAlN having low piezoelectric performances tends to be generated. In the deposition initial process, when the conductivity imparting element is doped as described above, the electric conductivity can be imparted to the region of cubic crystal or other region having low piezoelectric performances.

In the deposition latter process, without substantially doping the conductivity imparting element, the piezoelectric film is grown. As a result, on the ScAlN doped with the conductivity imparting element, ScAlN substantially not containing a conductivity imparting element is grown. This can provide a piezoelectric film including a lamination of ScAlN having an electric conductivity and ScAlN substantially not having an electric conductivity. It becomes possible to use the region having an electric conductivity in the piezoelectric film as, for example, an electrode.

On the other hand, in the deposition latter process, by performing deposition with a sufficient thickness, hexagonal-crystal wurtzite-structure ScAlN excellent in piezoelectric performances is generated. ScAlN having an electric conductivity can play a role as an electrode, and hence is less likely to cause the reduction of the piezoelectric performances of the piezoelectric film. Therefore, it becomes possible to obtain a piezoelectric film excellent in piezoelectric performances.

As described above, in accordance with the aspect, it is possible to provide a piezoelectric film exhibiting excellent piezoelectric performances, a method of manufacturing the same, a piezoelectric film laminated body, and a method of manufacturing the same. Incidentally, the parenthesized reference numerals described in the appended claims indicate the correspondence with the specific means described in embodiments described later, and are not intended to limit the technical scope of the present disclosure.

First Embodiment

An embodiment in accordance with a piezoelectric film will be described by reference to FIGS. 1 to 6. A piezoelectric film 1 is formed on the surface of a substrate 3 as shown in FIG. 1, for example, by sputtering.

The piezoelectric film 1 includes, for example, AlN crystal, a first element, and a second element. The piezoelectric film 1 is also referred to as a piezoelectric thin film, or the like. The first element and the second element are doped to the AlN crystal, and is solid-soluted in the AlN crystal. The first element and the second element are considered to be doped to a part of the Al site.

<AlN Crystal>

As the crystal structures of the AlN crystal, a hexagonal crystal system wurtzite structure and a cubic crystal system sphalerite structure are known. The hexagonal AlN crystal is stable in energy, and the piezoelectric performances such as the piezoelectric constant $d_{33}$ are also high. In the AlN crystal, Al exists in a trivalent form and in tetracoordination.

<First Element>

The first element is an element having a larger ionic radius in tetracoordination than that of Al. The ionic radius of trivalent Al in tetracoordination is 0.39 Å. For this reason, an element with an ionic radius in tetracoordination of more than 0.39 Å becomes an option for the first element. Conceivably, doping of such a first element to an AlN crystal improves the piezoelectric performances of the piezoelectric film.

The first element is preferably at least one selected from rare earth elements. In this case, the improving effect of the piezoelectric performances such as the piezoelectric constant $d_{33}$ is more enhanced. From the viewpoint of more enhancing the improving effect of the piezoelectric performances, the first element is more preferably Sc.

<Second Element>

The second element is an element having a smaller ionic radius in tetracoordination than that of Al. The ionic radius of trivalent Al in tetracoordination is 0.39 Å. For this reason, an element having an ionic radius in tetracoordination of smaller than 0.39 Å becomes an option for the second element. Addition of the second element improves the piezoelectric performances of AlN crystal doped with a large amount of the first element. The reason for this will be considered as follows with reference to piezoelectric films shown in FIGS. 2 to 6 according to comparative examples.

Figure 2:
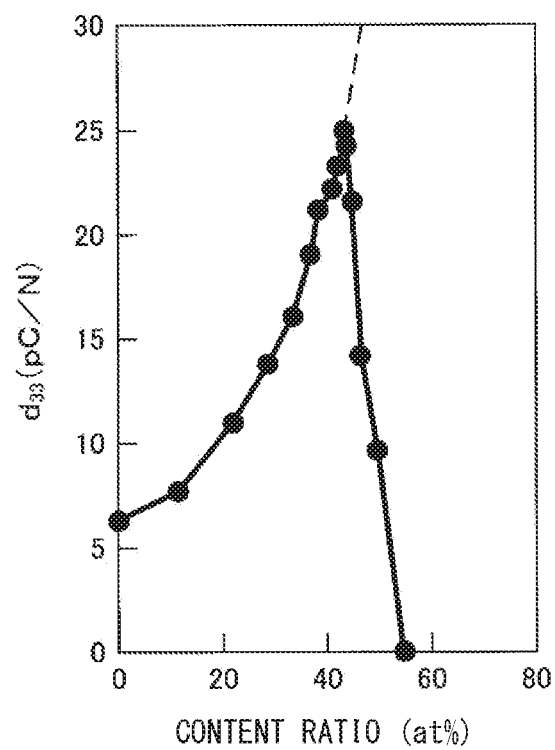
FIG. 2 is a view showing a relationship between the amount of Sc in the piezoelectric film including ScAlN and the piezoelectric constant $d_{33}$ of the piezoelectic film.

First, a piezoelectric film in which Sc is doped to an AlN crystal will be described. As shown in FIG. 2, an increase in amount of Sc to be doped to an AlN crystal improves the piezoelectric constant $d_{33}$. When the Sc amount is increased to the Sc high concentration region in which a ratio of the number of atoms of Sc to 100 at % of the total amount of the number of atoms of Sc and the number of atoms of Al exceeds 43 at %, the piezoelectric constant $d_{33}$ is reduced, and the reduction range is also large. Ideally, as indicated with the broken line of FIG. 2, it is expected that the piezoelectric constant $d_{33}$ is improved depending upon the Sc amount.

Figure 3A:
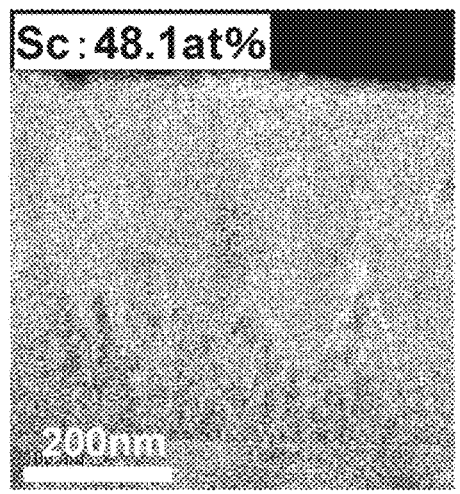
FIG. 3A is a view showing a cross sectional microphotograph of ScAlN having a Sc content of 48.1 at %.
Figure 4A:
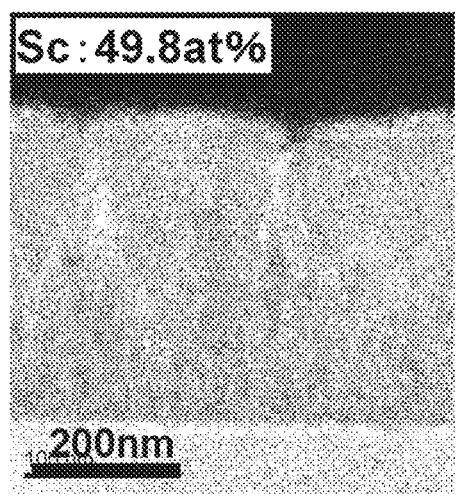
FIG. 4A is a cross sectional microphotograph showing ScAlN having a Sc content of 49.8 at %.

On the other hand, FIGS. 3A and 4A each show an electron microphotograph of the cross section of a piezoelectric film deposited on a substrate including silicon and the like. The piezoelectric film includes a Sc-doped AlN crystal. As shown in FIG. 3A, in the case where a ratio of the number of atoms of Sc to 100 at % of the total amount of the number of atoms of Sc and the number of atoms of Al is 48.1 at %, not only hexagonal crystal with high piezoelectric performances, but also cubic crystal without piezoelectric performances or with very low piezoelectric performances are generated in the piezoelectric film. Alternatively, as shown in FIG. 4A, when the doped amount of Sc is further increased, so that the Sc number of atoms becomes 49.8 at %, cubic crystals increase in amount. In other words, the reduction of the piezoelectric performances in the Sc high concentration region is caused by generation of cubic ScAlN. It is considered that the piezoelectric performances decrease with an increase in amount of cubic ScAlN. The ScAlN means Sc-doped AlN. Sc is considered to be doped to a part of the Al site of AlN.

Figure 3B:
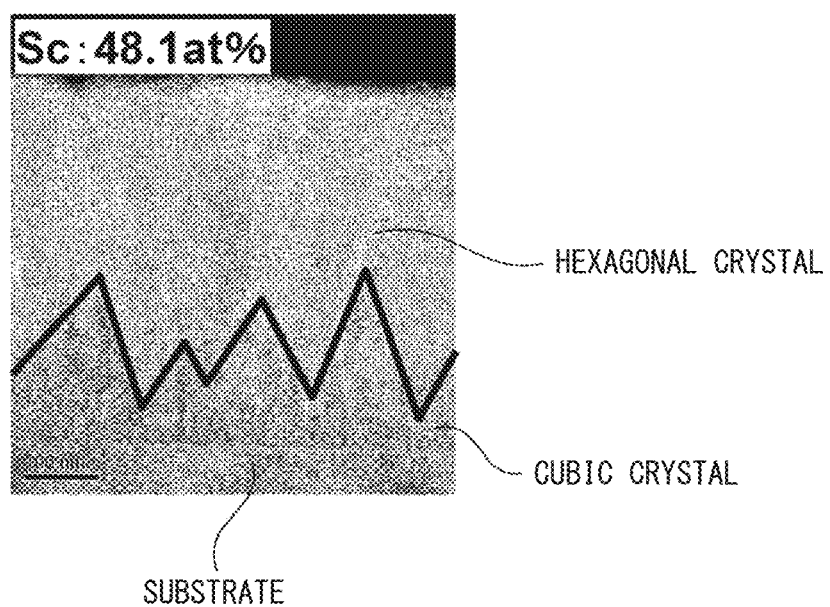
FIG. 3B is a view showing a phase boundary in FIG. 3A.
Figure 4B:
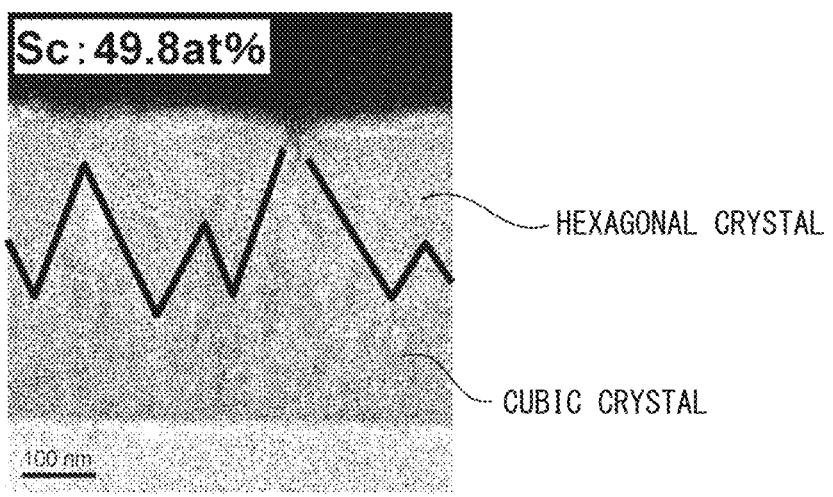
FIG. 4B is a view showing a phase boundary in FIG. 4A.
Figure 5:
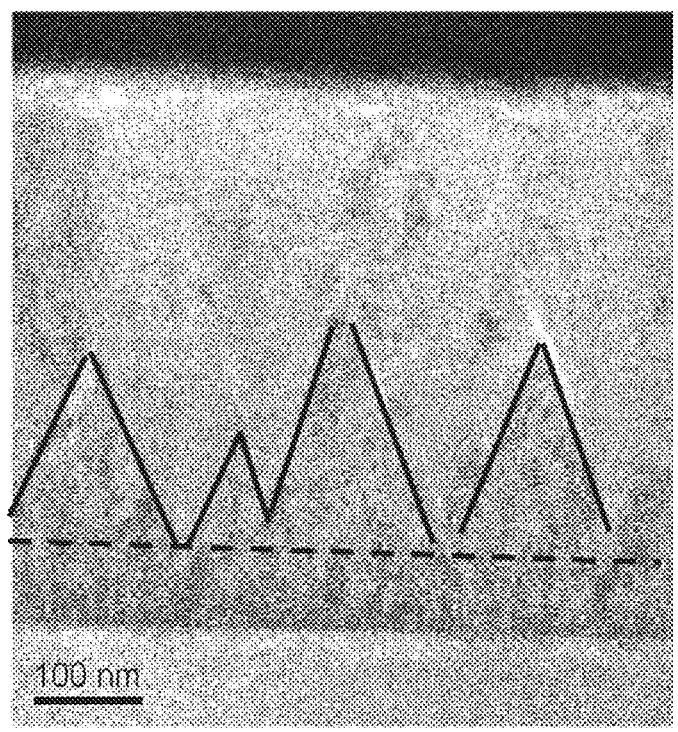
FIG. 5 is a view showing a broken line connecting the points at which switching from cubic crystal to hexagonal crystal is caused in FIG. 3B.

As shown in FIGS. 3B and 4B, the points at which switching from cubic crystal to hexagonal crystal occurs at the cross section in the thickness direction of the piezoelectric film seem to be arranged almost on a line. Each switching point is the apex on the substrate side of the phase boundary (i.e., the hetero interface between cubic crystal and hexagonal crystal) indicated with a zigzag solid line shown in FIGS. 3B and 4B. The points seem to be arranged on the broken line shown in FIG. 5. Incidentally, FIG. 5 is for the piezoelectric film with a Sc number of atoms of 48.1 at %. Conceivably, the same also applies to the piezoelectric film with a Sc number of atoms of 49.8 at %. Thus, assuming that, in the Sc high concentration region, the film stress shows the film thickness direction distribution, and is distributed across the threshold value on the line connecting the apexes on the substrate side of the phase boundary indicated with the broken line shown in FIG. 5, the actual measurement was performed in the following manner.

Figure 6:
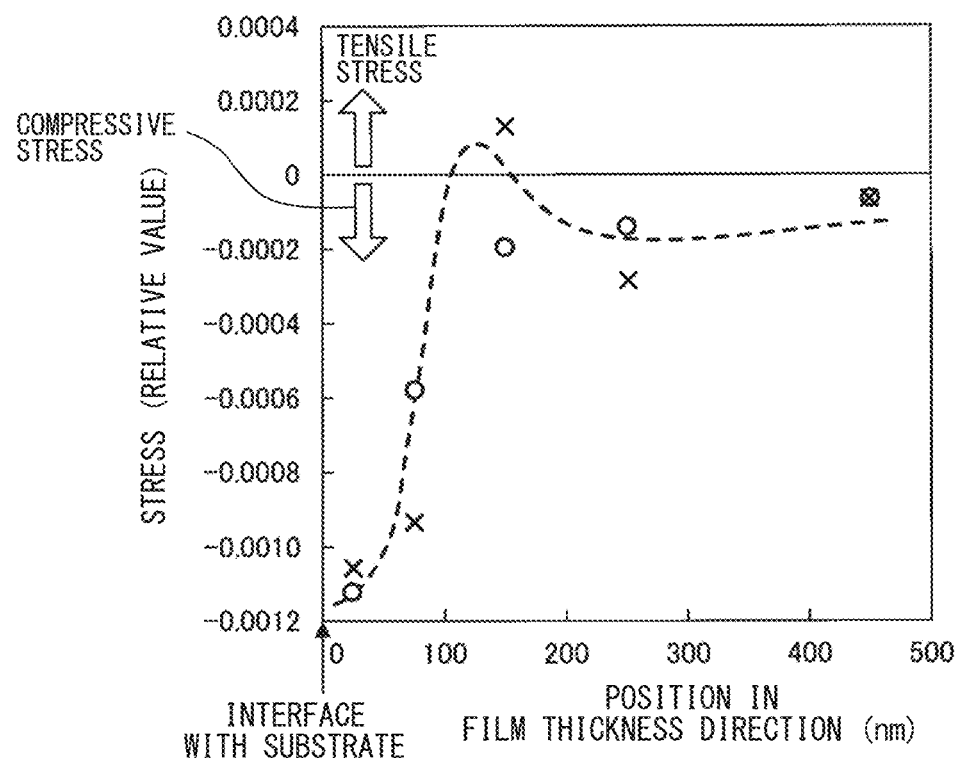
FIG. 6 is a view showing film stress profile results of a piezoelectric film including Sc-doped AlN according to a comparative example.

Specifically, FIG. 6 shows the film stress profile results of a piezoelectric film including Sc-doped AlN according to a comparative example. The piezoelectric film includes ScAlN, and is formed by being grown on a silicon substrate. As known from FIG. 6, with an increase in distance from the interface between the substrate and the piezoelectric film, the compressive stress in the piezoelectric film decreases. In the vicinity of the interface, the compressive stress is large. Conceivably, in the Sc high concentration region with a high Sc doped amount, the compressive stress becomes larger. Incidentally, in FIG. 6, the measured points ○ and the measured points × are the results obtained by measuring and determining the one-dimensional warp in a plurality of directions.

Thus, the cubic ScAlN is considered to be formed due to the compressive stress caused in the crystal of ScAlN growing from the substrate. In other words, conceivably, by doping a large amount of the first element such as Sc having a larger ionic radius in tetracoordination than that of Al, the compressive stress caused in ScAlN increases, resulting in formation of much cubic crystal.

When a piezoelectric film includes a second element having a smaller ionic radius than that of Al present in trivalent form and in tetracoordination in an AlN crystal together with the first element, a tensile strength relaxing or cancelling the compressive stress during deposition can be caused. Therefore, a cubic crystal becomes less likely to be formed during deposition. Particularly, as described above, in the first element high concentration region where the ratio of the number of atoms of the first element to 100 at % of the total amount of the number of atoms of the first element and the number of atoms of Al exceeds 43 at %, the compressive stress increases. For this reason, the effects of doping of the second element relaxing the compressive stress increase.

Therefore, from the viewpoint of sufficiently obtaining the effects of doping of the second element, the ratio of the number of atoms of the first element to 100 at % of the total amount of the number of atoms of the first element and the number of atoms of Al preferably exceeds 43 at %.

The second element is preferably a trivalent element. In this case, the insulating property of the piezoelectric film is also kept by doping of the second element. In other words, the doping of the second element can prevent the piezoelectric film from being imparted with the electric conductivity. In this case, doping of at least one kind of the second element allows the effects to be exhibited. This facilitates the adjustment of the doped amount. Specifically, the second element is more preferably B.

Both of a univalent element and a pentavalent element can be included as the second elements. In this case, the elements are preferably present so that the number of atoms of the univalent element and the number of atoms of the pentavalent element are substantially equivalent. As a result, the insulating property of the piezoelectric film is also kept by doping of a univalent element and a pentavalent element. In other words, the doping of a univalent element and a pentavalent element can prevent the electric conductivity from being imparted to the piezoelectric film. Being "substantially equivalent" is not necessarily required to be completely equivalent so long as the ratio of the amounts is the ratio capable of keeping the electric insulating property of the piezoelectric film. The elements are more preferably present with the number of atoms of the univalent element and the number of atoms of the pentavalent element being equivalent. The same also applies to the case of a divalent element and a tetravalent element described later, and other cases.

Both of a divalent element and a tetravalent element can be included as the second elements. In this case, the elements are preferably present so that the number of atoms of the divalent element and the number of atoms of the tetravalent element are substantially equivalent. As a result, the insulating property of the piezoelectric film is also kept by doping of a divalent element and a tetravalent element. In other words, the doping of a divalent element and a tetravalent element can prevent the electric conductivity from being imparted to the piezoelectric film.

When a divalent element and a tetravalent element are included as the second elements, as the divalent element, Be is exemplified. As the tetravalent element, at least one of C and Si is exemplified.

As the second elements, a given combination of two or more selected from the group consisting of a divalent element, a tetravalent element, and a pentavalent element can be adopted so as to achieve a mixing ratio capable of keeping the insulating property of the piezoelectric film. The same also applies to the combination of the second element, and a third element to a fifth element described later.

<Third Element>

The piezoelectric film can further include a third element together with the second element. The third element is the element to be doped when the second element is a pentavalent element. The third element has an ionic radius in tetracoordination equal to or larger than that of Al, and is a univalent element. The third element is a different element from the first element. The third element is considered to be doped to a part of the Al site of an AlN crystal.

In this case, the elements are preferably present so that the number of atoms of the second element of a pentavalent element and the number of atoms of the fourth element of a univalent element are substantially equivalent. As a result, the insulating property of the piezoelectric film is also kept by doping of a pentavalent element (i.e., a second element) and a univalent element (i.e., a third element). In other words, the doping of a pentavalent element and a univalent element can prevent the electric conductivity from being imparted to the piezoelectric film. Even when a third element having an ionic radius equal to or larger than that of Al is doped, the compressive stress is relaxed by the second element having a smaller ionic radius than that of Al. This enables the improvement of the piezoelectric performances.

Examples of such a combination of the second element and the third element are as follows. Examples of the second element may include at least one selected from the group consisting of V, Cr, Mn, P, and As. Examples of the third element may include at least one selected from the group consisting of Li, Na, and K.

<Fourth Element>

The piezoelectric film can further include a fourth element together with the second element. The fourth element is the element to be doped when the second element is a divalent element. The fourth element has an ionic radius in tetracoordination equal to or larger than that of Al, and is a tetravalent element. The fourth element is a different element from the first element. The fourth element is considered to be doped to a part of the Al site of an AlN crystal.

In this case, the elements are preferably present so that the number of atoms of the second element of a divalent element and the number of atoms of the fourth element of a tetravalent element are substantially equivalent. As a result, the insulating property of the piezoelectric film is also kept by doping of a divalent element (i.e., a second element) and a tetravalent element (i.e., a fourth element). In other words, the doping of a divalent element and a tetravalent element can prevent the electric conductivity from being imparted to the piezoelectric film. Even when a fourth element having an ionic radius equal to or larger than that of Al is doped, the compressive stress is relaxed by the second element having a smaller ionic radius than that of Al. This enables the improvement of the piezoelectric performances.

Examples of such a combination of the second element and the fourth element are as follows. As the second element, Be is exemplified. Examples of the fifth element may include at least one selected from the group consisting of Co, Cr, Ge, Ti, Zr, and Mo.

<Fifth Element>

The piezoelectric film can further include a fifth element together with the second element. The fifth element is the element to be doped when the second element is a tetravalent element. The fifth element has an ionic radius in tetracoordination equal to or larger than that of Al, and is a divalent element. The fifth element is a different element from the first element. The fifth element is considered to be doped to a part of the Al site of an AlN crystal.

In this case, the elements are preferably present so that the number of atoms of the second element of a tetravalent element and the number of atoms of the fifth element of a divalent element are substantially equivalent. As a result, the insulating property of the piezoelectric film is also kept by doping of a tetravalent element (i.e., a second element) and a divalent element (i.e., a fifth element). In other words, the doping of a tetravalent element and a divalent element can prevent the electric conductivity from being imparted to the piezoelectric film. Even when a fifth element having an ionic radius equal to or larger than that of Al is doped, the compressive stress is relaxed by the second element having a smaller ionic radius than that of Al. This enables the improvement of the piezoelectric performances.

Examples of such a combination of the second element and the fifth element are as follows. As the second element, at least one of C and Si is exemplified. Examples of the fifth element may include at least one selected from the group consisting of Mg, Co, Ni, Cu, and Zn.

Then, a method of manufacturing the piezoelectric film will be described. The method of manufacturing a piezoelectric film has no particular restriction, and is preferably performed by, for example, sputtering. The piezoelectric film 1 can be formed on the substrate 3 as shown in FIG. 1.

The substrate 3 is appropriately selected according to the use of the piezoelectric film. For the substrate, for example, silicon (Si), sapphire, silicon carbide, glass, or an organic material is often used.

The piezoelectric film is manufactured by, for example, sputtering. Sputtering may be single sputtering using one alloy target, or multiple sputtering using two or more metal targets. With single sputtering, an alloy target including aluminum, the first element, and the second element, and other elements doped, if required (e.g., the third to fifth elements) is used. With multiple sputtering, a plurality of targets including aluminum, the first element, the second element, and at least one selected from the group consisting of other elements doped, if required (e.g., the third to fifth elements) are used.

For example, by sputtering using an Al target doped with the first element and the second element, a piezoelectric film can be manufactured. Alternatively, a piezoelectric film can also be manufactured by sputtering using a first element target including the first element, a second element target including the second element, and an Al target. By sputtering using a first element-doped Al target, and a second element target including the second element, a piezoelectric film can also be manufactured. By sputtering using an alloy target including the first element and the second element, and an Al target, a piezoelectric film can also be manufactured. By sputtering using a second element-doped Al target, and a first element target including the first element, a piezoelectric film can also be manufactured. As for the third to fifth elements, targets including these may be used separately, or at least one selected from the third to fifth elements may be doped to a target including the first element, the second element, and Al.

Sputtering can be performed under, for example, an atmosphere including a nitrogen gas. Alternatively, sputtering can also be performed by irradiating a target with an ion beam including at least a nitrogen ions.

Specifically, under an atmosphere including at least a nitrogen gas, aluminum, the first element, the second element, and other elements doped, if required are sputtered from the target on a substrate. As a result, a piezoelectric film can be manufactured. Alternatively, a piezoelectric film can also be manufactured in the following manner: an alloy target and a substrate are placed so as to be opposed to each other; an ion beam including nitrogen ions is obliquely applied to the opposite surface to the alloy target; and from the alloy target, aluminum, the first element, the second element, and other elements doped, if required are sputtered on the substrate. The sputtering can be performed with single sputtering, or can be performed with multiple sputtering.

Below, as a representative example of the present embodiment, a method of manufacturing a piezoelectric film including Sc- and B-doped AlN crystal will be described. Sc and B are considered to be doped to a part of the Al site in the AlN crystal. Incidentally, also for the case using other first elements in place of Sc, and the case using other second elements in place of B, a piezoelectric film can be manufactured by the same sputtering as in the following manufacturing method.

<Single Sputtering>

A silicon substrate and an alloy target obtained by doping B to a ScAl alloy are prepared. The component elements in the alloy target and a nitrogen element are deposited on the silicon substrate by a sputtering, thereby manufacturing a piezoelectric film. Basically, the alloy target having the same B concentration as the B concentration in the piezoelectric film is used. However, when a deviation is caused between the B concentration in the alloy target and the B concentration in the piezoelectric film, the B concentration in the alloy target can be adjusted so that the B concentration in the piezoelectric film becomes a desirable concentration. The same also applies to the Sc concentration. The Sc content (at %), and B content (at %) in the piezoelectric film can be calculated by analysis with a commercially available wavelength dispersion type fluorescent X ray analysis device.

Single sputtering is performed according to a general method. With single sputtering, a layout in which a target and a substrate are opposed to each other (i.e., parallel plate type) can be adopted. In this case, the use efficiency of the alloy target in sputtering increases, and the deposition rate is improved.

<Double Sputtering>

The same operation as with single sputtering can be performed, except for using a silicon substrate, a ScAl alloy target, and a B target. With double sputtering, ScAl and B are sputtered on the substrate at the same time. With this method, by adjusting the cost of electricity to be applied to the ScAl alloy target and the B target, the adjustment of the B concentration can be performed with ease. Incidentally, by changing the target, it is also possible to perform other multiple sputtering.

The piezoelectric film of the present embodiment includes an AlN crystal, and the first element and the second element doped to the AlN crystal. The ratio of the number of atoms of the first element to 100 at % of the total amount of the number of atoms of the first element and the number of atoms of Al exceeds 43 at %. The first element is an element having a larger ionic radius in tetracoordination than that of Al. The second element is an element having a smaller ionic radius in tetracoordination than that of Al. The piezoelectric film having such a configuration is excellent in piezoelectric performances such as the piezoelectric constant $d_{33}$. The reason for this can be considered as follows.

In the first element high concentration region in which the ratio of the number of atoms of the first element to 100 at % of the total amount of the number of atoms of the first element and the number of atoms of Al exceeds 43 at %, as described above, an increase in compressive stress results in the formation of an cubic AlN crystal without or with low piezoelectric performances on the substrate side of the piezoelectric film during deposition. This can be considered due to the fact that the ionic radius in tetracoordination of the first element is larger than that of Al. Conceivably, when a second element having a smaller ionic radius in tetracoordination than that of Al is doped to such an AlN crystal, the compressive stress during deposition is relaxed, or cancelled. As a result, it is considered that a piezoelectric film with less cubic crystals disadvantageous in piezoelectric performances, or without cubic crystals is formed. Therefore, it is considered that the piezoelectric film exhibits excellent piezoelectric performances.

Second Embodiment

Figure 7:
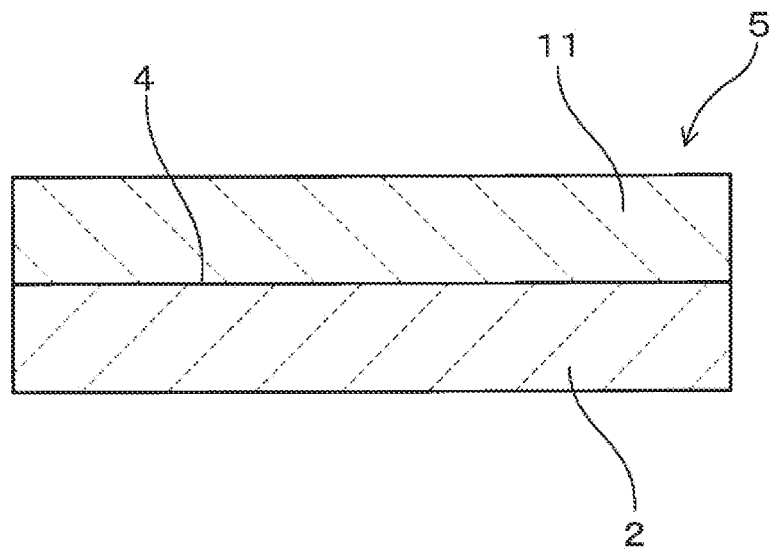
FIG. 7 is a cross sectional schematic view of a piezoelectric film laminated body having a lamination structure of an underlayer and a piezoelectric film in a second embodiment.

In the present embodiment, an aspect in which a piezoelectric film including ScAlN is deposited on a prescribed underlayer will be described. Specifically, by performing an underlayer preparing process and a depositing process, as shown in FIG. 7, a piezoelectric film 11 is deposited on an underlayer 2, thereby manufacturing a piezoelectric film laminated body 5. Of the reference signs and numerals used in the second embodiment, or later, the same ones as the reference signs and numerals used in the already described embodiments represent the same constitutional elements, and the like as those in the already described embodiments unless otherwise specified.

In the underlayer preparing process, the underlayer 2 is prepared. The underlayer 2 has a six-fold symmetric crystal lattice, or has a three-fold symmetric crystal lattice when the crystal structure of the underlayer 2 is observed from the thickness direction. When the underlayer 2 has a six-fold symmetric crystal lattice, the underlayer 2 including an underlayer material having a longer a-axis length than the a-axis length of ScAlN is prepared. On the other hand, when the underlayer 2 has a three-fold symmetric crystal lattice, the under layer including an underlayer material in which the nearest neighbor interatomic distance in lattice plane in parallel with the surface of the underlayer is longer than the a-axis length of ScAlN is prepared.

Figure 8:
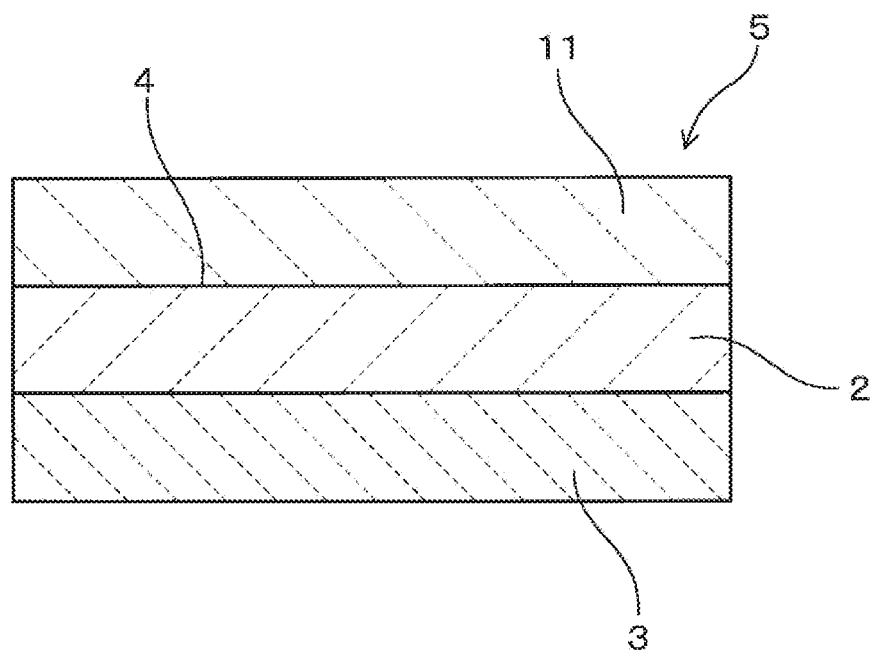
FIG. 8 is a cross sectional schematic view of the piezoelectric film laminated body including a substrate, an underlayer, and a piezoelectric film sequentially formed therein in the second embodiment.

In the depositing process, the piezoelectric film 11 including ScAlN is epitaxially grown from the surface of the underlayer 2. As a result, the piezoelectric film 11 can be manufactured. As shown in FIG. 7, when the underlayer 2 is present, the substrate is not required to be present. On the underlayer 2, the piezoelectric film 11 can be formed. Alternatively, as shown in FIG. 8, the piezoelectric film 11 may be formed on the underlayer 2 formed on the substrate 3.

<Underlayer Preparing Process>

As ScAlN (i.e., scandium aluminum nitride) to be deposited on the underlayer 2, a hexagonal crystal and a cubic crystal are present. A hexagonal crystal is advantageous from the viewpoint of the piezoelectric performances. The hexagonal ScAlN is formed by c-axis oriented growth from the underlayer 2. In other words, the c axis of hexagonal ScAlN and the thickness direction of the underlayer are in parallel with each other. When the crystal structure of the underlayer 2 is observed from the thickness direction of the underlayer 2, the crystal structure preferably has a six-fold symmetric crystal lattice. In this case, when ScAlN epitaxially grows from the underlayer 2, the crystal growth occurs in match with the six-fold symmetric crystal lattice of the underlayer. For this reason, hexagonal ScAlN tends to be deposited.

As the underlayer 2 having a six-fold symmetric crystal lattice, an underlayer having a c-axis oriented hexagonal crystal lattice can be used.

When the underlayer 2 has a six-fold symmetric crystal lattice, the underlayer 2 includes an underlayer material having a longer a-axis length in the crystal lattice than the a-axis length of ScAlN. The crystal structure of the underlayer 2 is the crystal structure as viewed from the direction in parallel with the c axis of hexagonal ScAlN to be deposited on the underlayer 2.

Incidentally, the c axis of hexagonal ScAlN is generally in parallel with the growth direction of ScAlN, the thickness direction of the underlayer, the thickness direction of the piezoelectric film, and the like. The a axis of hexagonal ScAlN is generally orthogonal to the c axis of ScAlN, the thickness direction of the underlayer, the thickness direction of the piezoelectric film, and the like.

<Depositing Process>

As described above, when as the underlayer 2, an underlayer having a longer a-axis length of its crystal lattice than the a-axis length of hexagonal ScAlN to grow on the underlayer 2 is used, along with a compressive stress, a tensile stress acts on the a-axis direction of ScAlN to epitaxially grow from the underlayer 2. The compressive stress and the tensile stress are opposite in direction to each other. This enables the tensile stress to relax or cancel the compressive stress acting on ScAlN during deposition. As a result, it is possible to form a piezoelectric film having a high content ratio of hexagonal-crystal wurtzite-structure ScAlN excellent in piezoelectric performances due to suppression of the formation of cubic ScAlN.

(Underlayer Material Having Hexagonal Crystal Lattice)

An underlayer material having a hexagonal crystal lattice is used in a-axis oriented state. In other words, the c axis of the crystal lattice forming the underlayer 2 and the thickness direction of the underlayer 2 are in parallel with each other. As the options for the underlayer material, ZnO, GaN, and the like of the same hexagonal-crystal wurtzite structure as that of ScAlN can be considered. However, within a range of the ratio of Sc to 100 at % of the total amount of the number of atoms of Sc and the number of atoms of Al in ScAlN is 50 at % or less, the a-axis length of ScAlN is 0.35 nm or less, and may be larger than the a-axis length of ZnO (specifically, 0.325 nm), and the a-axis length of GaN (specifically, 0.318 nm). In other words, even when an underlayer including ZnO or GaN is used, a tensile stress may not be caused in ScAlN sufficiently during deposition.

On the other hand, it is confirmed by the first-principles calculation of simulation that the a-axis length is elongated by doping additive element such as Ca to ZnO. Also for GaN, it is confirmed that the a-axis length is elongated by doping of Sc, La, or the like. The elongation of the a-axis length requires only the doping of an element with a large ionic radius. Therefore, ZnO doped with a divalent element having a larger ionic radius in tetracoordination than that of Zn, GaN doped with a trivalent element having a larger ionic radius in tetracoordination than that of Ga, and the like can be used as the underlayer materials.

The underlayer material preferably includes ZnO doped with at least one element selected from the group consisting of Ca, Sr, and Ba, or GaN doped with at least one element selected from the group consisting of Sc, Y, and La. In this case, the a-axis length of the underlayer 2 having a hexagonal crystal lattice can be sufficiently elongated. Therefore, when ScAlN epitaxially grows from the underlayer, a tensile stress is sufficiently caused in ScAlN, which can sufficiently relax or cancel the compressive stress. Accordingly, the formation of cubic ScAlN is more suppressed.

The hexagonal InN has an a-axis length of 0.354 nm, and hence can be used as the underlayer material even without the doping of an additive element. InN doped with a trivalent element having a larger ionic radius in tetracoordination than that of In may be used.

As the underlayer material, the material including ZnO doped with an element other than a divalent element having a larger ionic radius in tetracoordination than that of Zn, GaN doped with an element other than a trivalent element having a larger ionic radius in tetracoordination than that of Ga, or InN doped with an element other than a trivalent element having a larger ionic radius in tetracoordination than that of In can be used. In this case, the underlayer can exhibit an electric conductivity. In other words, Zn in ZnO is present in a divalent state, and hence is imparted with the electric conductivity by being doped with an element other than divalent elements. Ga in GaN, and In in InN are respectively present in a trivalent state, and hence are imparted with the electric conductivity by doping GaN and InN with an element other than trivalent elements, respectively. Therefore, it becomes possible to use the underlayer as, for example, an electrode after deposition. In other words, the piezoelectric film 11 in the piezoelectric film laminated body 5 can be used as the piezoelectric material, and the underlayer 2 can be used as an electrode electrically connected with the piezoelectric film 11.

As the underlayer material, Ti of hexagonal metal can be used. The a-axis length of Ti is 0.359 nm. In this case, during epitaxial growth of ScAlN, a tensile stress can be caused from the underlayer 2, and the underlayer 2 can exhibit the electric conductivity. Therefore, it becomes possible to use the underlayer 2 after deposition as an electrode.

(Underlayer Material Having Cubic Crystal Lattice)

As the underlayer 2, it is also possible to use an underlayer of which the crystal structure has a three-fold symmetric crystal lattice when the crystal structure is observed from the thickness direction. When the underlayer material has a three-fold symmetric crystal lattice, the material of which the nearest neighbor interatomic distance in the lattice plane in parallel with the surface of the underlayer 2 is longer than the a-axis length of ScAlN is used. As such an underlayer 2, for example, an underlayer having a (111)-oriented cubic crystal lattice can be used. The interatomic distance in the case where the underlayer has a (111)-oriented cubic crystal lattice will be hereinafter appropriately referred to as the "a-axis equivalent length".

The underlayer material of the cubic crystal lattice is used in a (111)-oriented state. In other words, the <111> axis of the crystal lattice forming the underlayer and the thickness direction of the underlayer become parallel with each other. In such an underlayer, when the underlayer is observed from the <111> axis direction, atoms form an array including a regular triangle as the minimum lattice in a (111) plane. The neighbor interatomic distance (i.e., the a-axis equivalent length) in this case is calculated from the lattice constant$\times\sqrt{2}$ for the body-centered cubic lattice, and the lattice constant/$\sqrt{2}$ for the face-centered cubic lattice.

Examples of the (111)-oriented cubic underlayer material may include diamond structural material, sphalerite structural material, Ta, or Cr. As the diamond structural materials, Si, Ge, and the like may be mentioned. As the sphalerite structural materials, GaAs, GaP, and the like may be mentioned. The lattice constant of Si of a diamond structure is 0.543 nm, the lattice constant of Ge of a diamond structure is 0.565 nm, the lattice constant of GaAs of a sphalerite structure is 0.565 nm, the lattice constant of GaP of a sphalerite structure is 0.545 nm, the lattice constant of Ta is 0.287 nm, and the lattice constant of Cr is 0.288 nm. The a-axis equivalent length of Si of a diamond structure is 0.384 nm, the a-axis equivalent length of Ge of a diamond structure is 0.400 nm, the a-axis equivalent length of GaAs of a sphalerite structure is 0.400 nm, the a-axis equivalent length of GaP of a sphalerite structure is 0.385 nm, the a-axis equivalent length of Ta is 0.406 nm, and the a-axis equivalent length of Cr is 0.407 nm.

Also when the underlayer including such a (111)-oriented cubic crystal is used, a tensile stress can be caused in ScAlN during epitaxial deposition, thereby relaxing a compressive stress or cancelling a compressive stress. When Ta or Cr is used as the underlayer material, it becomes possible to use the underlayer after deposition as an electrode.

The ratio of Sc to 100 at % of the total amount of the number of atoms of Sc and the number of atoms of Al in ScAlN of the piezoelectric film preferably exceeds 43 at %. In this case, the compressive stress relaxing effect by the underlayer becomes noticeable. In other words, in the piezoelectric film including ScAlN of high concentration more than 43 at %, the compressive stress applied in the film during deposition tends to increase. However, by using a specific underlayer as described above, such a large compressive stress can be relaxed or cancelled.

The underlayer preparing process and the depositing process can be performed by, for example, sputtering. A description will be given to an example in which a piezoelectric film laminated body having an underlayer including Ca-doped ZnO and a piezoelectric film including ScAlN formed on the underlayer is manufactured by sputtering.

First, using a Zn target, plasma discharging is performed in an Ar-containing oxygen atmosphere, and ZnO is deposited on, for example, a substrate 3 by reactive sputtering. At this process, using a Zn target together with a Ca target material, simultaneous sputtering (i.e., double sputtering) may be performed, or single sputtering using a Zn target doped with Ca with a desirable concentration may be performed. Single sputtering is suitable for mass production. Single sputtering and double sputtering can be performed in the same manner as in the first embodiment. ZnO has a wurtzite structure as with ScAlN, and is a material which tends to be c-axis oriented by adjusting the deposition conditions. It is not necessary to select the material for the substrate and the plane orientation of the substrate.

In this manner, the underlayer 2 is formed on the substrate 3. The underlayer 2 includes Ca-doped ZnO, and is c-axis oriented. Then, ScAlN is deposited on the underlayer 2. Both of ZnO and ScAlN have a hexagonal structure, and hence ScAlN tends to epitaxially grow. However, when the surface of the underlayer 2 is exposed to the atmosphere, so that contaminants such as water and CO2 are deposited on the surface, the epitaxial growth may be inhibited. Therefore, during deposition of the underlayer 2 and the piezoelectric film 11, vacuum transport is preferably performed. From the viewpoint of avoiding the deposition of contaminants, for example, it is possible to adopt a method in which sputtering is sequentially performed in a vacuum chamber having both of the Ca-doped Zn target and the ScAl target material. Preferably, a method is desirable in which in a device having a plurality of vacuum chambers, parallel plate type sputtering using a Ca-doped Zn target, and parallel plate type sputtering using a ScAl target material are sequentially performed in each vacuum chamber. This method is particularly suitable for mass productivity.

In the manufacturing example by the sputtering, the case of the underlayer including Ca-doped ZnO was described. The same also applies to manufacturing of a piezoelectric film laminated body having another underlayer and a piezoelectric film capable of sputtering. When the underlayer is nitride, oxidation of the surface by exposure to the atmosphere inhibits the epitaxial growth, resulting in an increase in necessity of vacuum transport. Generally, epitaxial growth often indicates the growth of a film of nearly single crystal on the single crystal underlayer, but, in the description, includes the case where the underlayer is a polycrystal such as a columnar crystal structure. Such epitaxial growth on the underlayer indicates, for example, the state in which growth occurs with the atomic arrangements being roughly matched on individual columnar crystals, respectively.

After the underlayer preparing process and the depositing process, as shown in FIGS. 7 and 8, a piezoelectric film laminated body 5 having an underlayer 2 and a piezoelectric film 11 is obtained. The underlayer 2 has a specific crystal structure as described above, and the piezoelectric film 11 is formed on the surface of the underlayer 2. The piezoelectric film laminated body 5 has a contact surface 4 between the underlayer 2 and the piezoelectric film 11, and the piezoelectric film 11 is in contact with the underlayer 2 at the contact surface 4.

With the piezoelectric film laminated body 5 having such a configuration, as described above, the compressive stress applied on the piezoelectric film 11 during deposition is relaxed or cancelled. Therefore, it is considered that the abundance of cubic ScAlN which tends to be formed on the underlayer 2 side of ScAlN formed on the underlayer 2 is reduced. Therefore, it is considered that the piezoelectric film laminated body 5 includes a large amount of hexagonal ScAlN excellent in piezoelectric performances in the piezoelectric film 11. The piezoelectric film laminated body 5 having such a configuration of the underlayer 2 and the piezoelectric film 11 is considered to be excellent in piezoelectric performances such as the piezoelectric constant $d_{33}$. Conceivably, the smaller the abundance of cubic ScAlN in the piezoelectric film 11, the higher the piezoelectric performances. The abundance of the cubic ScAlN in the piezoelectric film 11 is most desirably 0.

Figure 9A:
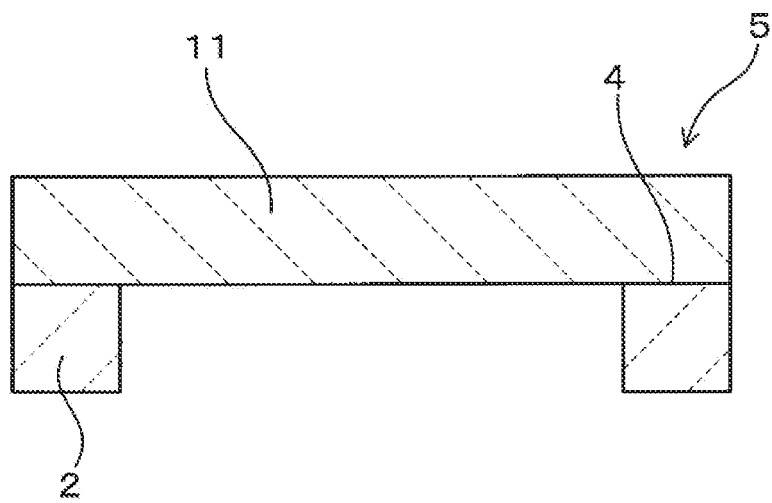
FIG. 9A is a cross sectional schematic view of a piezoelectric film laminated body from which the underlayer has been partially removed.

As shown in FIG. 9A, the underlayer 2 of the piezoelectric film laminated body 5 can be removed at least partially. The removal can be performed by, for example, etching. Whether the underlayer 2 is required to be removed or not can be determined according to the use of the piezoelectric film laminated body 5, and the like.

Figure 9B:
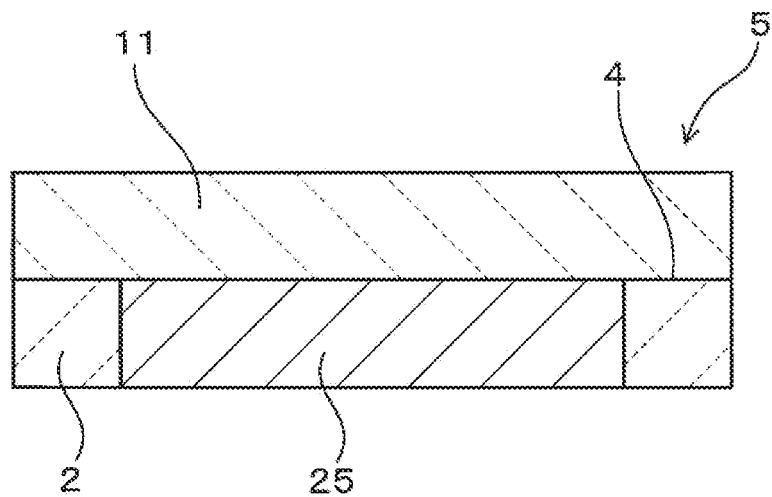
FIG. 9B is a cross sectional schematic view of the piezoelectric film laminated body in which an electrode is formed at the underlayer-removed part.

For example, as shown in FIG. 9A, the underlayer 2 can be partially removed from the piezoelectric film laminated body 5 by etching or the like. When the underlayer 2 includes an insulating material not having an electric conductivity, or the like, the underlayer 2 is partially removed, and as shown in FIG. 9B, the removed region is filled with a conductive material such as a metal. As a result, an electrode 25 in contact with the piezoelectric film 11 can be formed.

The configuration in which the second element is doped in the first embodiment and the configuration in which a specific underlayer is provided in the second embodiment can be combined. Specifically, when the piezoelectric film including ScAlN is deposited on the underlayer of the second embodiment, the second element can be doped. In this case, conceivably, the compressive stress during deposition is more relaxed, or the compressive stress become more likely to be cancelled, which can more suppress the formation of cubic ScAlN.

Third Embodiment

In the present embodiment, a description will be given to an embodiment of a piezoelectric film having a laminated crystal structure of a hexagonal crystal and a cubic crystal. The piezoelectric film has a cubic ScAlN crystal, and a hexagonal ScAlN crystal stacked on the cubic ScAlN crystal. The interface of both crystals is not necessarily required to be flush with each other, and may be mutually entangled. Specific examples of such a laminated crystal structure may include the configurations shown in FIGS. 3A and 4A.

To the cubic ScAlN, conductivity imparting elements including elements other than trivalent elements are doped. Although the conductivity imparting elements may be desirably doped to at least a part of the cubic ScAlN, the conductivity imparting elements are preferably doped to the whole cubic ScAlN as much as possible. As a result, the electric conductivity is imparted to the cubic ScAlN without or with low piezoelectric performances, and the cubic ScAlN can be used as, for example, an electrode.

It is considered that the conductivity imparting elements are doped to a part of the Al site of ScAlN. In ScAlN, Al is present as a trivalent ion. For this reason, doping of the conductivity imparting elements other than trivalent elements imparts the electric conductivity to the cubic ScAlN.

Also to the hexagonal ScAlN, the conductivity imparting elements may be partially doped. From the viewpoint of improvement of the piezoelectric performances, the hexagonal ScAlN doped with the conductivity imparting elements is more preferably present in a smaller amount.

The conductivity imparting elements may be doped alone, or two or more of the conductivity imparting elements may be doped in combination. However, when two or more conductivity imparting elements are doped, the combinations cancelling mutual electric conductivities are excluded. Specifically, the combinations in which univalent conductivity imparting elements and pentavalent conductivity imparting elements are doped at the same number of atoms are excluded. Further, the combinations in which bivalent conductivity imparting elements and tetravalent conductivity imparting elements are doped at the same number of atoms are excluded.

Examples of the conductivity imparting element may include group 1, group 2, group 12, and transition metal elements (however, other than Sc, Y, lanthanoid, and actinoid). These can be used alone, or in combination of two or more thereof.

The piezoelectric film of the present embodiment has a laminated crystal structure of a hexagonal crystal and a cubic crystal. The hexagonal ScAlN crystal is excellent in piezoelectric performances such as the piezoelectric constant $d_{33}$. On the other hand, the cubic ScAlN has no or low piezoelectric performances, and as described above, can exhibit an electric conductivity by doping of the conductivity imparting elements. Therefore, it becomes possible to use the cubic ScAlN as, for example, an electrode. In other words, the cubic ScAlN can be used as an electrode electrically connected with the hexagonal ScAlN.

The ratio of Sc to 100 at % of the total amount of the number of atoms of Sc and the number of atoms of Al in ScAlN preferably exceeds 43 at %. In this case, cubic ScAlN without or with low piezoelectric performances tends to be formed. Therefore, the advantage resulting from the impartment of the electric conductivity to the cubic ScAlN by doping of the conductivity imparting elements is enhanced.

Figure 10:
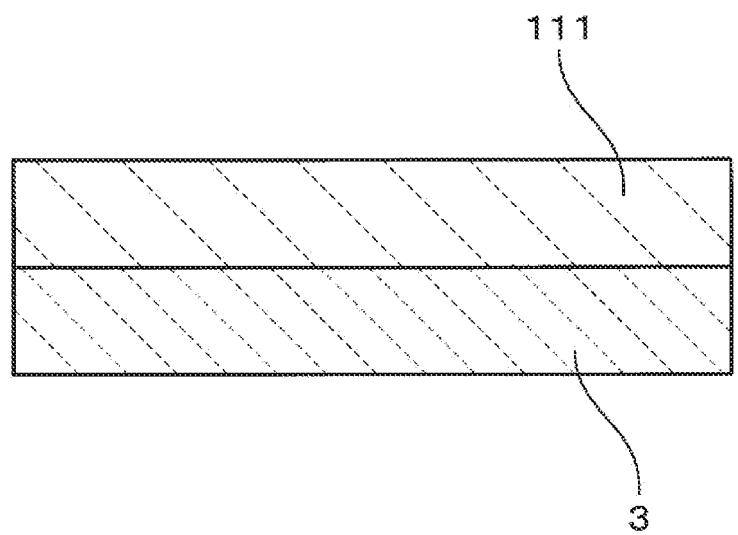
FIG. 10 is a cross sectional schematic view of a piezoelectric film formed on a substrate in a third embodiment.

Then, a method of manufacturing a piezoelectric film of the present embodiment will be described. As shown in FIG. 10, by depositing a piezoelectric film 111 including ScAlN on a substrate 3, it is possible to manufacture the piezoelectric film 111. Specifically, by performing the following deposition initial process and the deposition latter process, it is possible to manufacture the piezoelectric film 111.

In the deposition initial process, while doping a conductivity imparting element at the initial stage of deposition of the piezoelectric film 111, the piezoelectric film 111 including ScAlN is epitaxially grown. In the deposition latter process, substantially without doping a conductivity imparting element, a piezoelectric film including ScAlN is epitaxially grown.

In the deposition initial process and the deposition latter process, the piezoelectric film 111 can be deposited by, for example, sputtering. Sputtering can be performed in the same manner as, for example, the first embodiment.

The timing of switching between the deposition initial process and the deposition latter process can be appropriately adjusted. For example, for deposition of ScAlN with a high Sc content, cubic ScAlN tends to be formed in a large amount on the substrate side. For this reason, the timing of switching from the deposition initial process to the deposition latter process is preferably delayed. On the other hand, for deposition of ScAlN with a low Sc content, the amount of cubic ScAlN to be formed tends to decrease. For this reason, the switching timing can be advanced. Therefore, for example, the switching timing can be adjusted based on the Sc amount in ScAlN.

Between the deposition initial process and the deposition latter process, a deposition intermediate process of gradually reducing the amount of the conductivity imparting element to be doped may be set. In this case, the continuity of the crystal structure becomes more likely to be kept, so that the crystallinity of ScAlN becomes good. For example, in sputtering, by gradually reducing the electric power to be applied to the target including the conductivity imparting element, it is possible to perform the deposition intermediate process.

The piezoelectric film 111 can be formed on the substrate 3. The material for the substrate 3 has no particular restriction. Examples thereof may include silicon, a conductive metal, sapphire, SiC, glass, or an organic material.

Below, a specific example the manufacturing method of the present embodiment will be shown. In this example, a description will be given to an example in which the conductivity imparting element is Ti, and deposition is performed by double sputtering.

First, a layout capable of simultaneous sputtering of a ScAl alloy target and a Ti target (i.e., double sputtering) is set. Under such a layout, as with the first embodiment, sputtering is performed under an atmosphere including a nitrogen gas.

In the deposition initial process to be the initial stage of deposition, simultaneous sputtering is performed, thereby epitaxially growing ScAlN while doping Ti. As a result, Ti-doped ScAlN is formed on a substrate. The concentration of Ti in ScAlN can be controlled by the ratio of electric powers to be applied to two targets. The concentration of Ti is preferably adjusted to a degree as not to break the crystal structure of ScAlN. Specifically, the content of the conductivity imparting element to 100 at % of the total amount of the number of atoms of Sc, the number of atoms of Al, and the conductivity imparting element such as Ti can be set at, for example, several tens atomic percent or less.

Then, after an elapse of a given time from deposition, the electric power to the Ti target is turned off, thereby forming ScAlN not doped with Ti. When the electric power applied to the Ti target is turned off, the electric power can be turned off while being gradually reduced. As a result, the continuity of the crystal structure can be kept, and the crystallinity of ScAlN can be made good.

Single sputtering also enables deposition of a Ti-doped ScAlN crystal. Specifically, first, using a Ti-doped ScAl alloy target, sputtering is performed. Then, using a ScAl alloy target not doped with Ti, sputtering is performed. As a result, the ScAlN not doped with Ti can be deposited on the Ti-doped ScAlN. In this case, in each sputtering, a parallel plate type layout can be assumed, which becomes suitable for mass production.

However, during transport of the substrate between respective sputterings, the surface is preferably prevented from being exposed to the atmosphere. Specifically, a method of transport between the vacuum chambers under vacuum conditions in a device having two vacuum chambers, and other methods can be considered.

Thus, in the piezoelectric film 111 of the present embodiment, cubic ScAlN and hexagonal ScAlN are sequentially formed from the substrate 3 side. Then, a conductivity imparting element is doped to cubic ScAlN which is disadvantageous in terms of piezoelectric performances, thereby making cubic ScAlN conductive at least partially. Therefore, in the piezoelectric film 111, an electrical connection between ScAlN made conductive and hexagonal ScAlN having high piezoelectric performances becomes possible.

As described up to this point, the embodiments of the present disclosure were described. The present disclosure is not limited to respective embodiments described above, and can be applied to various embodiments within the scope not departing from the gist thereof.

The piezoelectric film and the piezoelectric film laminated body can be used for, for example, an angular acceleration sensor, an optical scanner, an ultrasonic transducer, a microphone, a frequency filter, a pressure sensor, an energy harvester, and an ink jet printhead.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A piezoelectric film laminated body comprising:
   an underlayer; and
   a piezoelectric film including ScAlN and formed on a surface of the underlayer,
   wherein the underlayer has a six-fold symmetric crystal lattice when a crystal structure of the underlayer is observed from a direction in parallel with a c-axis of a crystal of the ScAlN, and includes an underlayer material having an a-axis length in the six-fold symmetric crystal lattice longer than an a-axis length of the ScAlN.

2. The piezoelectric film laminated body according to claim 1,
   wherein the underlayer material has a c-axis oriented hexagonal crystal lattice.

3. The piezoelectric film laminated body according to claim 1,
   wherein the underlayer material includes ZnO doped with a divalent element having an ionic radius in tetracoordination larger an ionic radius of Zn in tetracoordination, GaN doped with a trivalent element having an ionic radius in tetracoordination larger than an ionic radius of Ga in tetracoordination, InN doped with a trivalent element having an ionic radius in tetracoordination larger than an ionic radius of In in tetracoordination, InN, or Ti.

4. The piezoelectric film laminated body according to claim 1,
   wherein the underlayer material includes ZnO doped with at least one element selected from the group consisting of Ca, Sr, and Ba, or GaN doped with at least one element selected from the group consisting of Sc, Y, and La.

5. The piezoelectric film laminated body according to claim 1,
   wherein the underlayer material includes ZnO doped with an element other than a divalent element and having an ionic radius in tetracoordination larger than an ionic radius of Zn in tetracoordination, GaN doped with an element other than a trivalent element and having an ionic radius in tetracoordination larger than an ionic radius of Ga in tetracoordination, or InN doped with an element other than a trivalent element and having an ionic radius in tetracoordination larger than an ionic radius of In in tetracoordination.

6. A piezoelectric film laminated body comprising:

an underlayer; and a piezoelectric film including ScAlN and formed on a surface of the underlayer, wherein the underlayer has a three-fold symmetric crystal lattice when a crystal structure of the underlayer is observed from a direction in parallel with a c-axis of a crystal of the ScAlN, and includes an underlayer material having a nearest neighbor interatomic distance in a lattice plane in parallel with the surface of the underlayer longer than an a-axis length of the ScAlN.

7. The piezoelectric film laminated body according to claim 6, wherein the underlayer material has a (111)-oriented cubic crystal lattice.

8. The piezoelectric film laminated body according to claim 6, wherein the underlayer material includes a diamond structural material, a sphalerite structural material, Ta, or Cr.

9. The piezoelectric film laminated body according to claim 6, wherein, in the ScAlN of the piezoelectric film, a ratio of the number of atoms of Sc to 100 at % of a total amount of the number of atoms of Sc and the number of atoms of Al exceeds 43 at %.

* * * * *